United States Patent
Javvaji et al.

(10) Patent No.: US 12,265,137 B2
(45) Date of Patent: Apr. 1, 2025

(54) DIAGNOSTIC PATH FOR GAIN AND OFFSET CALIBRATION

(71) Applicant: Allegro MicroSystems, LLC, Manchester, NH (US)

(72) Inventors: Arun Prasad Javvaji, Manchester, NH (US); Craig S. Petrie, Merrimack, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 300 days.

(21) Appl. No.: 18/056,821

(22) Filed: Nov. 18, 2022

(65) Prior Publication Data

US 2024/0168104 A1 May 23, 2024

(51) Int. Cl.
*G01R 33/00* (2006.01)
*G01R 33/06* (2006.01)

(52) U.S. Cl.
CPC ......... *G01R 33/0017* (2013.01); *G01R 33/06* (2013.01)

(58) Field of Classification Search
CPC . G01R 33/0017; G01R 33/00; G01R 33/0035
USPC ....................................................... 324/121
See application file for complete search history.

(56) References Cited

U.S. PATENT DOCUMENTS

| | | | |
|---|---|---|---|
| 10,451,671 B2 | 10/2019 | Petrie et al. | |
| 10,466,298 B2 | 11/2019 | Chaware et al. | |
| 10,613,158 B2 | 4/2020 | Cook et al. | |
| 10,635,539 B2 | 4/2020 | Cook et al. | |
| 10,908,232 B2 | 2/2021 | Latham et al. | |
| 11,402,440 B2 | 8/2022 | Chaware et al. | |
| 2016/0139199 A1* | 5/2016 | Petrie | G01R 33/07 324/750.3 |
| 2016/0139230 A1* | 5/2016 | Petrie | G01R 33/072 324/225 |
| 2017/0161218 A1* | 6/2017 | Lapomardo | G06F 13/4068 |
| 2019/0362619 A1* | 11/2019 | Petrie | G01D 3/08 |

FOREIGN PATENT DOCUMENTS

| | | | | |
|---|---|---|---|---|
| CN | 112834973 A | * | 5/2021 | ........... A61B 5/6803 |
| ES | 2884781 T3 | * | 12/2021 | ......... G01R 33/0017 |

OTHER PUBLICATIONS

Translation of ES-2884781-T3 (Year: 2021).*

* cited by examiner

*Primary Examiner* — Christopher P McAndrew
(74) *Attorney, Agent, or Firm* — Daly, Crowley, Mofford & Durkee, LLP

(57) ABSTRACT

A method for use in a magnetic field sensor, including: in each of a plurality of calibration periods, generating a reference magnetic field based on a different one of a plurality of drive codes; storing, in a memory, a plurality of values of a reference magnetic field signal that is generated in response to the reference magnetic field, each of the values of the reference magnetic field signal being generated by sampling the reference magnetic field signal in a different one of the plurality of calibration periods; calculating a calibration gain coefficient based on the plurality of values of the reference magnetic field signal; and storing the calibration gain coefficient in the memory and using the calibration gain coefficient to adjust an output of the magnetic field sensor.

20 Claims, 11 Drawing Sheets

232

```
MEMORY
  ┌─────────────────────────────────────┐
  │   DRIVE CODE DATABASE 231           │
  └─────────────────────────────────────┘
  ┌─────────────────────────────────────┐
  │   FACTORY GAIN COEFFICIENT $K_{FG}$ │
  └─────────────────────────────────────┘
  ┌─────────────────────────────────────┐
  │   FACTORY OFFSET COEFFICIENT $K_{FO}$│
  └─────────────────────────────────────┘
  ┌─────────────────────────────────────┐
  │  CALIBRATION GAIN COEFFICIENT $K_{CG}$│
  └─────────────────────────────────────┘
  ┌─────────────────────────────────────┐
  │ CALIBRATION OFFSET COEFFICIENT $K_{CO}$│
  └─────────────────────────────────────┘
```

| CURRENT MAGNITUDE | EXPECTED VALUE OF OUTPUT SIGNAL |
|---|---|
| DRIVE CODE_1   [IREF = $I_1$] | OUT_VAL_1 |
| DRIVE CODE_2   [IREF = $I_2$] | OUT_VAL_2 |
| DRIVE CODE_3   [IREF = $I_3$] | OUT_VAL_3 |

251 points to each row.

FIG. 2D

DIAGNOSTIC PATH FOR GAIN AND OFFSET CALIBRATION

BACKGROUND

Magnetic field sensors including a magnetic field sensing element, or transducer, such as a Hall Effect element or a magnetoresistive element, are used in a variety of applications to detect aspects of movement of a ferromagnetic article, or target, such as proximity, speed, and direction. Applications using these sensors include, but are not limited to, a magnetic switch or "proximity detector" that senses the proximity of a ferromagnetic article, a proximity detector that senses passing ferromagnetic articles (for example, magnetic domains of a ring magnet or gear teeth), a magnetic field sensor that senses a magnetic field density of a magnetic field, and a current sensor that senses a magnetic field generated by a current flowing in a current conductor. Magnetic field sensors are widely used in automobile control systems, for example, to detect ignition timing from a position of an engine crankshaft and/or camshaft, and to detect a position and/or rotation of an automobile wheel for anti-lock braking systems.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, a method is provided for use in a magnetic field sensor, comprising: in each of a plurality of calibration periods, generating a reference magnetic field based on a different one of a plurality of drive codes; storing, in a memory, a plurality of values of a reference magnetic field signal that is generated in response to the reference magnetic field, each of the values of the reference magnetic field signal being generated by sampling the reference magnetic field signal in a different one of the plurality of calibration periods; calculating a calibration gain coefficient based on the plurality of values of the reference magnetic field signal; and storing the calibration gain coefficient in the memory and using the calibration gain coefficient to adjust an output of the magnetic field sensor.

According to aspects of the disclosure, a magnetic field sensor is provided, comprising: a sensing module including at least two magnetic field sensing elements; a memory; and a processing circuitry that is configured to: in each of a plurality of calibration periods, generate a reference magnetic field based on a different one of a plurality of drive codes; store, in the memory, a plurality of values of a reference magnetic field signal that is generated by the sensing module in response to the reference magnetic field, each of the values of the reference magnetic field signal being generated by sampling the reference magnetic field signal in a different one of the plurality of calibration periods; calculate a calibration gain coefficient based on the plurality of values of the reference magnetic field signal; and store the calibration gain coefficient in the memory and use the calibration gain coefficient to adjust an output of the magnetic field sensor.

According to aspects of the disclosure, a magnetic field sensor is provided, comprising: a sensing module including at least two magnetic field sensing elements; a memory; and a processing circuitry that is configured to: generate a calibration offset coefficient based on a value of a reference magnetic field signal while a reference coil is not energized, the reference magnetic signal being generated by the sensing module in response to a reference magnetic field that is produced by the reference coil; retrieve, from the memory, a factory offset coefficient; calculate a difference between the factory offset coefficient and the calibration offset coefficient; and output a diagnostic signal based on the difference, wherein the diagnostic signal is set to a first value that is indicative of a fault when the difference exceeds a predetermined threshold, and the diagnostic signal is set to a second value that is indicative of no fault when the difference does not exceed the predetermined threshold.

According to aspects of the disclosure, a system is provided comprising: a reference coil; a sensing module including at least two magnetic field sensing elements; a memory; and a processing circuitry that is configured to: in each of a plurality of calibration periods, use the reference coil to generate a reference magnetic field based on a different one of a plurality of drive codes; store, in the memory, a plurality of values of a reference magnetic field signal that is generated by the sensing module in response to the reference magnetic field, each of the values of the reference magnetic field signal being generated by sampling the reference magnetic field signal in a different one of the plurality of calibration periods; calculate a calibration gain coefficient based on the plurality of values of the reference magnetic field signal; and store the calibration gain coefficient in the memory and use the calibration gain coefficient to adjust an output of the system.

According to aspects of the disclosure, a system is provided, comprising: means for generating a reference magnetic field, in each of a plurality of calibration periods, based on a different one of a plurality of drive codes; means for storing, in a memory, a plurality of values of a reference magnetic field signal that is generated in response to the reference magnetic field, each of the values of the reference magnetic field signal being generated by sampling the reference magnetic field signal in a different one of the plurality of calibration periods; means for calculating a calibration gain coefficient based on the plurality of values of the reference magnetic field signal; and means for storing the calibration gain coefficient in the memory and using the calibration gain coefficient to adjust an output of the system.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

FIG. 2C is a diagram of an example of a memory of the magnetic field sensor of FIGS. 2A-B, according to aspects of the disclosure;

FIG. 2D is a diagram of an example of a drive code database, according to aspects of the disclosure;

DETAILED DESCRIPTION

Figure 1:
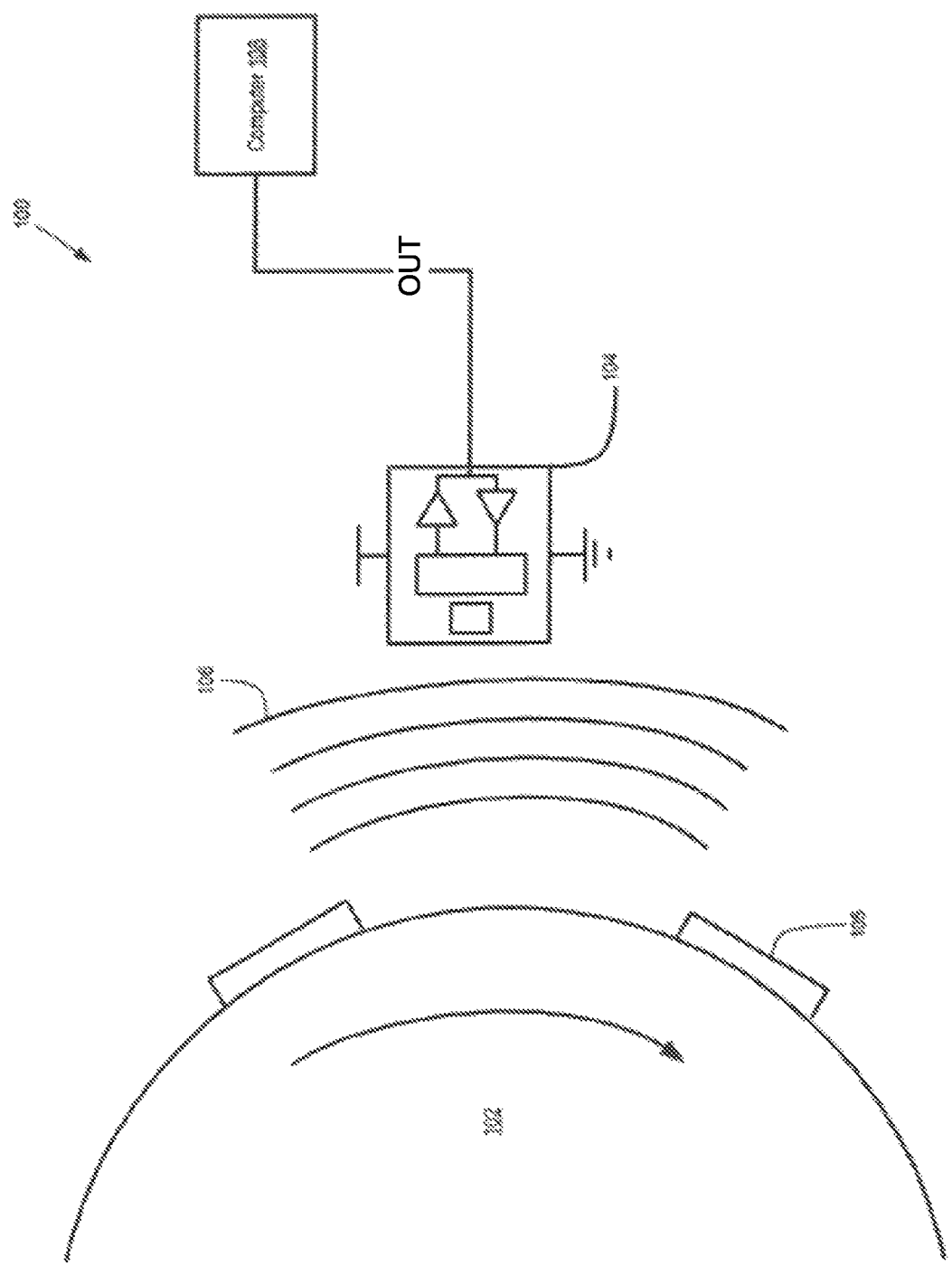
FIG. 1 is a diagram of an example of a system, according to aspects of the disclosure.

In one aspect of the disclosure, a magnetic field sensor is provided that may utilize both factory trim coefficients and trim coefficients that are calculated by the sensor at runtime. Both types of trim coefficients may be used to correct the gain and/or offset of a magnetic field signal that is generated by the sensor. According to the present disclosure, it has been determined that utilizing both a factory gain coefficient and a calibration gain coefficient is advantageous because it can improve the accuracy of the magnetic field sensor.

In another aspect of the disclosure, the magnetic field sensor may utilize an improved technique for calculating a gain trim coefficient. The technique relies on using a set of different reference magnetic fields to generate a plurality of data points that are subsequently combined into a single gain trim coefficient. In some implementations, each of the data points may be generated over a different calibration period of the operation of the magnetic field sensor. According to the present disclosure, it has been determined that generating a calibration gain coefficient that is calculated based on multiple data points, that are generated in response to different reference magnetic fields, can improve the accuracy of the magnetic field sensor.

In yet another aspect of the disclosure, the magnetic field sensor may generate a diagnostic signal based on the presence (or absence) of a discrepancy between a factory trim coefficient and a calibration trim coefficient that is calculated by the sensor at runtime. For example, if the difference between a factory trim coefficient and a trim coefficient that is calculated by the sensor at runtime exceeds a threshold, the sensor may set the diagnostic signal to a value that is indicative of the presence of a fault. On the other hand, if the difference is less than the threshold, the sensor may set the diagnostic signal to a value that is indicative of no fault. The diagnostic signal may be used by external circuitry to detect faults in the operation of the sensor.

The magnetic field sensor may be any sensor that includes one or more magnetic field sensing elements. According to the examples of FIGS. 1-6B, the magnetic field sensor is a speed sensor. However, alternative implementations are possible in which the magnetic field sensor is a position sensor, an angle sensor, a torque sensor, a current sensor, and/or any other suitable type of magnetic field sensor. Stated succinctly, the techniques of which examples are presented throughout the disclosure are not limited to being applied in any specific type of magnetic field sensor. Throughout the disclosure, the factory trim coefficients that are used by the sensor are also referred to as "a factory gain coefficient" and "a factory offset coefficient". Throughout the disclosure, the trim coefficients that are generated by the sensor at runtime are also referred to as "a calibration gain coefficient" and a "calibration offset coefficient."

Turning to FIG. 1, a block diagram of a system 100 for detecting a target 102 is shown to include a magnetic field sensor 104 placed adjacent to target 102 so that a magnetic field 106 can be sensed by magnetic field sensor 104. In an embodiment, target 102 is a magnetic target and produces external magnetic field 106. In another embodiment, magnetic field 106 is generated by a magnetic source (e.g. a back-bias magnet or electromagnet) that is not physically coupled to target 102. A target 102 may be either a magnetic or a non-magnetic target. In these instances, as target 102 moves through or within magnetic field 106, it causes perturbations to external magnetic field 106 that can be detected by sensor 104.

Sensor 104 may detect and process changes in external magnetic field 106. For example, sensor 104 may detect changes in magnetic field 106 as target 102 rotates and features 105 move closer to and away from sensor 104, thus increasing and decreasing the strength of the magnetic field 106 sensed by sensor 104. Sensor 104 may include circuitry to determine the speed, direction, proximity, angle, etc. of target 102 based on these changes to magnetic field 106. Although target 102 is shown as a toothed gear, other arrangements and shapes that can affect magnetic field 106 as target 102 rotates are possible. For example, target 102 may have a non-symmetrical shape (such as an oval), may include sections of different material that affect the magnetic field, etc.

In an embodiment, sensor 104 is coupled to a computer 108, which may be a general-purpose processor executing software or firmware, a custom processor, or a custom electronic circuit for processing output signal OUT from sensor 104. Output signal OUT may provide information about the speed, position, and/or direction of motion of target 102 to computer 108, which may then perform operations based on the received information. In an embodiment, computer 108 is an automotive computer (also referred to as an engine control unit) installed in a vehicle and target 102 is a moving part within the vehicle, such as a transmission shaft, a brake rotor, etc. Sensor 104 detects the speed and direction of target 102 and computer 108 controls automotive functions (like all-wheel drive, ABS, speedometer display control, etc.) in response to the information provided by sensor 104.

In an embodiment, computer 108 may be located relatively distant from sensor 104. For example, computer 108 may be located under the hood of a vehicle while sensor 104 is located at a wheel or transmission element near the bottom and/or rear of the vehicle. In such an embodiment, having a serial communication interface with a minimal number of electrical connections (e.g. wires) between computer 108 and sensor 104 may be beneficial, and may reduce cost and maintenance requirements.

In embodiments, where sensor 104 operates as part of a system that affects vehicular safety such as the brake or transmission system, it may be desirable for sensor 104 to perform self-tests and report to computer 108 any errors or faults that occur.

In embodiments, sensor 104 includes built-in self-test ("BIST") circuits or processes that can test the sensor 104.

The self-tests can include analog tests that test analog circuit portions of sensor 104 and digital tests that test digital circuit portions of sensor 104. The self-tests may also include test circuits or procedures that test both analog and digital portions of sensor 104. It may be desirable for the self-tests to provide test coverage of sensor 104 that includes as many circuits as possible, in order to increase the test coverage and effectiveness of the tests in finding faults.

Figure 2A:
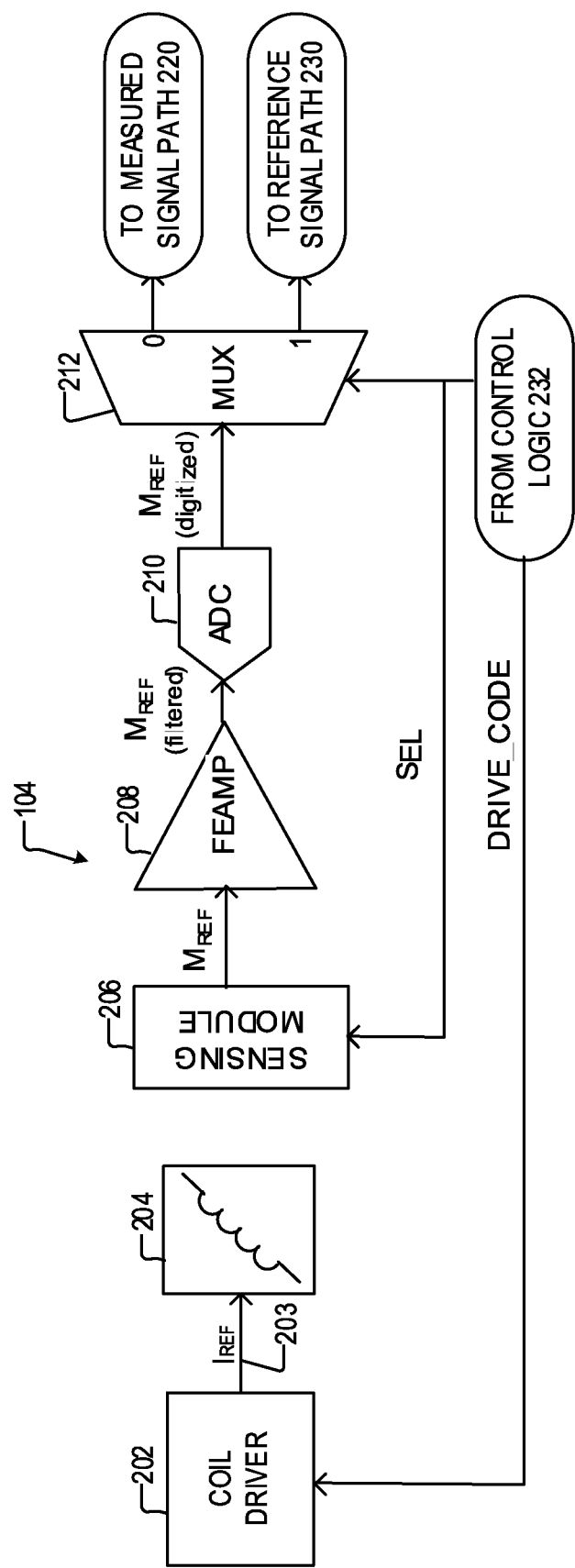
FIG. 2A is a diagram of an example of a magnetic field sensor, according to the aspects of the disclosure.
Figure 2B:
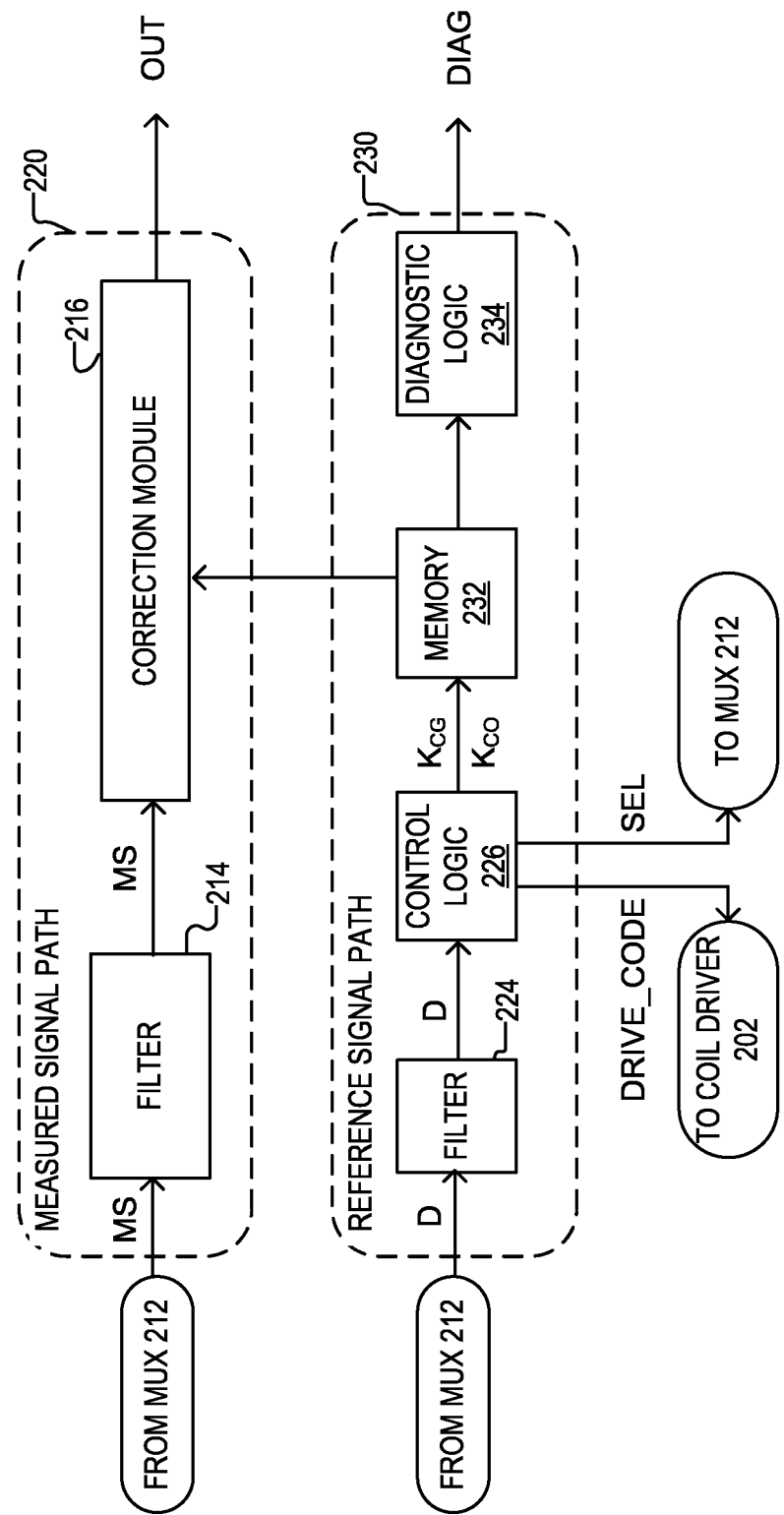
FIG. 2B is a diagram of an example of a magnetic field sensor, according to aspects of the disclosure.

FIGS. 2A-B illustrate an example of one possible implementation of the sensor 104. In the example of FIGS. 2A-B, the sensor 104 includes a coil driver 202, a sensing module 206, a frontend amplifier 208, an analog-to-digital converter (ADC) 210, a multiplexer 212, a measured signal path 220, and a reference signal path 230.

The coil driver 202 may be any suitable type of electronic circuitry for driving a reference coil 204. The reference coil 204 may include a coil that is arranged to generate a reference magnetic field. According to the present example, the reference coil 204 and the coil driver 202 are part of the sensor 104. According to the present example, all components of the sensor 104 are formed on the same substrate (e.g., a silicon die) and packaged in the same semiconductor package. However, alternative implementations are possible in which, at least one of reference coil 204 and the coil driver 202 is external to the sensor 104.

The sensing module 206 may include one or more magnetic field sensing elements. According to the present example, the magnetic field sensing elements are Hall elements. However, alternative implementations are possible in which another type of magnetic field sensing element is used to implement the sensing module 206, such as a giant magentoresistor (GMR) or a tunnel magnetoresistor (TMR), etc. Stated succinctly, the present disclosure is not limited to any specific implementation of the magnetic field sensing elements in the sensing module 206. One possible implementation of the sensing module 206 is discussed in further detail with respect to FIG. 2F.

The measured signal path 220 may include a filter 214 and a correction module 216. The filter 214 may include one or more filters, such as a comb filter or a finite impulse response filter. In some implementations, the correction module 216 may include an arithmetic unit that is configured to adjust the gain and/or offset of the signal SM by evaluating Equation 1, which is discussed further below with respect to FIG. 3. In some implementations, the correction module 216 may be configured to perform a process 300, which is discussed further below with respect to FIG. 3. Additionally or alternatively, in some implementations, the correction module 216 may include one or more of a general-purpose processing core, a special-purpose processing core, an application-specific circuit, a signal processor, and/or any other suitable type of processing circuitry.

The reference signal path 230 may include a filter 224, a control logic 226, a memory 232, and a diagnostic logic 234. The filter 224 may include one or more filters, such as a comb filter or a finite impulse response filter. The control logic 226 may include any suitable type of special purpose- or general-purpose processing circuitry. For example, the control logic 226 may include one or more of a general-purpose processing core, a special-purpose processing core, an application-specific circuit, a signal processor, and/or any other suitable type of processing circuitry. The diagnostic logic 234 may include one or more of a general-purpose processing core, a special-purpose processing core, an application-specific circuit, a signal processor, and/or any other suitable type of processing circuitry. Although in the example of FIGS. 2A-B the correction module 216, the control logic 226, and the diagnostic logic 234 are depicted as separated entities, in some implementations they may be integrated together. Irrespective of how they are implemented, under the nomenclature of the present application, the correction module 216, the control logic 226, and the diagnostic logic 234 are also referred to as "a processing circuitry" of the sensor 104.

The memory 232 may include any suitable type of volatile and/or non-volatile memory. Although the memory 232 is depicted as a singular block, it will be understood that in some implementations, the memory 232 may include multiple memory blocks. For example, the memory 232 may include a memory unit that is part of the control logic 226, a memory unit that is part of the diagnostic logic 234, and/or a memory unit that is part of the correction module 216. Stated succinctly, the present disclosure is not limited to any specific implementation of the memory 232 and/or any specific distribution of different parts of the memory across respective components of the sensor 104.

As illustrated in FIG. 2C-D, the memory 232 may be configured to store a drive code database 231, a factory gain coefficient $K_{FG}$, a factory offset coefficient $K_{FO}$, a calibration gain coefficient $K_{CG}$, and a calibration offset coefficient $K_{CO}$. The drive code database 231 may include a plurality of entries 251. Each entry 251 may map a drive code to an expected output signal value. The drive code database may include one or more data structures, that are configured to store the entries 251. Although in the example of FIG. 2D the drive code database is implemented as a lookup table, it will be understood that the present disclosure is not limited to any specific implementation of the drive code database 231. Furthermore, in some implementations, the database 231 may be replaced with digital logic that is configured to apply different drive codes to the coil driver 202. As discussed further below, such logic may be configured to apply 0V at the reference coil 204, as well as a +nV and −nV, where n is a predetermined voltage value. In some implementations, such logic may be implemented directly in the coil driver.

As illustrated in FIG. 2A, the coil driver 202 may drive the reference coil 204 with a signal $I_{REF}$, which is supplied on drive line 203. The term "drive code" may refer to an identifier one or more characteristics of the electrical current that is used to drive the reference coil 204. Similarly, the term "drive code" may also refer to a signal (digital or analog) that specifies (or determines) the direction and/or level of current that is going to be passed through the reference coil 204. In some implementations, any of the drive codes may specify one or more of the magnitude or direction of the current that is required to be supplied by the coil driver 202 to the reference coil 204. As another example, any of the drive codes may identify the voltage that is required to be applied across the reference coil 204.

As used herein, the term "expected output signal value" may include an identifier of the response to sensing module 206 in response to a reference magnetic field that is generated by the reference coil 204. The expected output signal value in any of the entries 251 may identify the response that the sensing module 206 is expected to have (under ideal circumstances) when the reference coil 204 is driven with current having the characteristics specified by the same entry's 251 respective drive code. By way of example, the expected output signal value for any drive code may include the value that a signal D (shown in FIG. 2B) is expected to have when the reference coil is driven with current having the characteristics specified by the drive code. In some implementations, each of the entries 251 in the drive code database may store a different drive code. In the example of FIG. 2B, applying drive_code 1 on the coil driver 202 may cause the signal $I_{REF}$ to have a value $I_1$; applying drive_code 2 on the coil driver 202 may cause the signal $I_{REF}$ to have a value $I_2$; and applying drive_code 3 on the coil driver 202 may cause the signal $I_{REF}$ to have a value $I_3$.

Returning to FIGS. 2A-B, the factory gain coefficient $K_{FG}$ may include a number (or another identifier) that specifies, at least in part, the amount by which the gain of the output of the sensing module 206 has to be corrected to remove the error that is expected to be present in the output. The calibration gain coefficient $K_{CG}$ may include a number (or another identifier) that specifies, at least in part, the amount by which the gain of the output of the sensing module 206 has to be corrected to remove the error that is expected to be present in the output. One difference between the coefficients $K_{FG}$ and $K_{CG}$ may be that the coefficient $K_{FG}$ is stored in the memory 232 before the sensor 104 is shipped to a customer, and the value of $K_{CG}$ is calculated by the sensor 104 after the sensor 104 is deployed and running. Additionally or alternatively, in some implementations, another difference between the coefficients $K_{FG}$ and $K_{CG}$ may be that the coefficient $K_{CG}$ is necessarily calculated by the sensor 104 (or the control logic 226), whereas the coefficient $K_{FG}$ may not be calculated by the sensor 104 at all. For instance, the coefficient $K_{FG}$ may be calculated by a device at the manufacturer's facilities that is external to the sensor 104. Additionally or alternatively, in some implementations, one difference between the coefficients $K_{FG}$ and $K_{CG}$ may be that the coefficient $K_{FG}$ is calculated under ideal circumstances, in which the sensor 104 is correctly positioned (e.g., relative to a target) and free of defects, whereas the coefficient $K_{CG}$ may be influenced by any defects or errors in the installation of the sensor 104. In this regard, as is discussed further below, discrepancies between coefficients $K_{CG}$ and $K_{FG}$ may be used to detect faults in the sensor 104.

The factory offset coefficient $K_{FO}$ may include a number (or another identifier) that specifies, at least in part, the amount by which the output of the sensing module 206 has to be adjusted additively to remove error that is expected to be present in the output. The calibration offset coefficient $K_{CO}$ may include a number (or another identifier) that specifies, at least in part, the amount by which the output of the sensing module 206 has to be offset to remove the error that is expected to be present in the output. One difference between the coefficients $K_{FO}$ and $K_{CO}$ may be that the coefficient $K_{FO}$ is stored in the memory 232 in the factory before the sensor 104 is shipped to a customer, and the value of $K_{CO}$ is calculated by the sensor 104 after the sensor 104 is deployed and running. Additionally or alternatively, in some implementations, another difference between the coefficients $K_{FO}$ and $K_{CO}$ may be that the coefficient $K_{CO}$ is necessarily calculated by the sensor 104 (or the control logic 226), whereas the coefficient $K_{FO}$ may not be calculated by the sensor 104 at all. For instance, the coefficient $K_{FO}$ may be calculated by a device at the manufacturer's facilities that is external to the sensor 104. Additionally or alternatively, in some implementations, another difference between the coefficients $K_{FO}$ and $K_{CO}$ may be that the coefficient $K_{FO}$ is calculated under ideal circumstances, in which the sensor 104 is correctly positioned (e.g., relative to a target) and free of defects, whereas the coefficient $K_{CO}$ may be influenced by any defects or errors in the installation of the sensor 104. In this regard, as is discussed further below, discrepancies between coefficients $K_{CO}$ and $K_{FO}$ may be used to detect faults in the sensor 104.

In operation, the sensor 104 may alternate between being in an active state and a calibration state. The sensor 104 may be in the active state when a signal SEL that is output by the control logic 226 is set to a first value (e.g., '0'). The sensor 104 may be in the calibration state when the signal SEL is set to a second value (e.g., '1') by the control logic 226. As is discussed further below with respect to FIG. 2F, when the sensor 104 is in the calibration state, the sensing module 206 may assume a configuration that rejects the measured magnetic field, and when the sensor is in the active state, the sensing module 206 may assume a configuration that does not reject the measured magnetic field (and which rejects the reference magnetic field instead).

The operation of the sensor 104 in the active state is now described in further detail. When the sensor 104 is in the active state, the sensing module 206 may sense an external magnetic field. The external magnetic field may be a magnetic field that is, at least in part, generated by a target, such as the target 102. An example of an external magnetic field is the magnetic field 106, which is shown in FIG. 1. Under the nomenclature of the present, the external magnetic field is also referred to as a "measured magnetic field." In response to the measured magnetic field, the sensing module 206 may generate a signal $M_{REF}$ that is indicative of the magnitude of the measured magnetic field. The signal $M_{REF}$ may be output by the sensing module 206 to the frontend amplifier 208. The frontend amplifier 208 may amplify the signal M REF and output the amplified signal $M_{REF}$ to the ADC 210. The ADC 210 may digitize the amplified signal M REF and output the digitized signal $M_{REF}$ to the multiplexer 212. The multiplexer 212 may provide the digitized signal $M_{REF}$ to the filter 214. The filter 214 may filter the digitized signal M REF and output a measured magnetic field signal SM. The measured magnetic field signal SM may be generated by filtering the digitized signal $M_{REF}$. The correction module 216 may generate an output signal OUT by adjusting at least one of the gain and/or offset of the measured magnetic field signal SM. According to the present example, the output signal OUT is output from the sensor 104 to an external device. However, alternative implementations are possible in which the output signal OUT is output to another component (not shown) of the sensor 104. Under the nomenclature of the present disclosure, the signal $M_{REF}$, or any of its derivatives, if output while the sensor 104 is in the active state, may also be referred to as a measured magnetic field signal.

The operation of the sensor 104 in the calibration state is now described in further detail. When the sensor 104 is in the calibration state, the control logic 226 may provide an indication of drive code to the coil driver 202. The indication may be either an analog or digital signal. The coil driver 202 may generate the signal $I_{REF}$ based on the drive code and drive the reference coil 204 with the signal $I_{REF}$. As noted above, the signal $I_{REF}$ may have one or more characteristics that are specified by the drive code, such as current magnitude and direction or voltage level. In response to the signal $I_{REF}$, the reference coil 204 may generate a reference magnetic field. The sensing module 206 may sense the reference magnetic field and generate a signal $M_{REF}$ in response to the reference magnetic field. The frontend amplifier 208 may amplify the $M_{REF}$ and output the amplified signal $M_{REF}$ to the ADC 210. The ADC 210 may digitize the signal $M_{REF}$ and output the digitized signal $M_{REF}$ to the multiplexer 212. The multiplexer 212 may route the digitized signal $M_{REF}$ to the filter 224. The filter 224 may filter the digitized signal $M_{REF}$ to produce a reference magnetic field signal D. The control logic 226 may process one or more values of the signal D that are generated in different calibration periods to calculate the calibration gain coefficient $K_{CG}$ and the calibration offset coefficient $K_{CO}$. The coefficients $K_{CG}$ and $K_{CO}$ may be subsequently stored in the memory 232. The diagnostic logic 234 may generate a diagnostic signal DIAG based on at least one of the coefficients $K_{CG}$ and $K_{CO}$. Under the nomenclature of the present disclosure, the signal $M_{REF}$, or any of its derivatives, if output while the sensor 104 is in the calibration state, may also be referred to as a measured magnetic field signal. The operation of the control logic 226 and/or the diagnostic logic 234 is discussed further below with respect to FIGS. 3-6B.

Figure 2E:
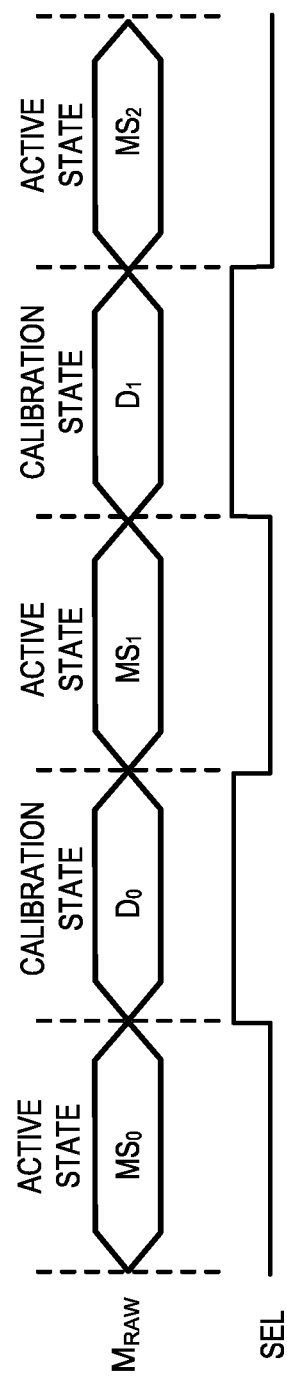
FIG. 2E is a signal diagram illustrating aspects of the operation of the magnetic field sensor of FIGS. 2A-B, according to aspects of the disclosure.

FIG. 2E is a signal diagram illustrating aspects of the operation of the sensor 104, according to aspects of the disclosure. As illustrated, the sensor 104 may alternate between an active state and a calibration state. The time periods in which the sensor 104 is in the active state are referred to as active periods. The time periods in which the sensor 104 is in the calibration state are referred to as calibration periods. As noted above, the electrical signal $M_{REF}$ that is output by the sensing module 206 in each of the calibration periods is herein referred to as a "measured magnetic field signal". Similarly, the electrical signal that is output by the sensing module 206 in each of the calibration periods is herein referred to as a "measured magnetic field signal". Put differently, in some implementations, the term "measured magnetic field signal" may refer to the signal that is output by the sensing module 206 when the sensing module is in the configuration shown in diagram 270 of FIG. 2F, and the term "reference magnetic field signal" may refer to the signal that is output by the sensing module 206 when the sensing module is the configuration shown in diagram 272 of FIG. 2F. In some implementations, the sensor 104 may alternate between the active state and the calibration state a predetermined number of times (e.g., three times) after the sensor 104 is powered on, after which the sensor 104 may remain continuously in the active state until the sensor 104 is powered off and powered on again. Although in the present example, the calibration periods are interleaved with active periods, alternative implementations are possible in which the calibration periods are consecutive or distributed differently in relation to the active periods. In such implementations, each of the calibration periods may be characterized by a different drive code being applied to the coil driver 202 and a different reference magnetic field being generated by the reference coil 202.

Figure 2F:
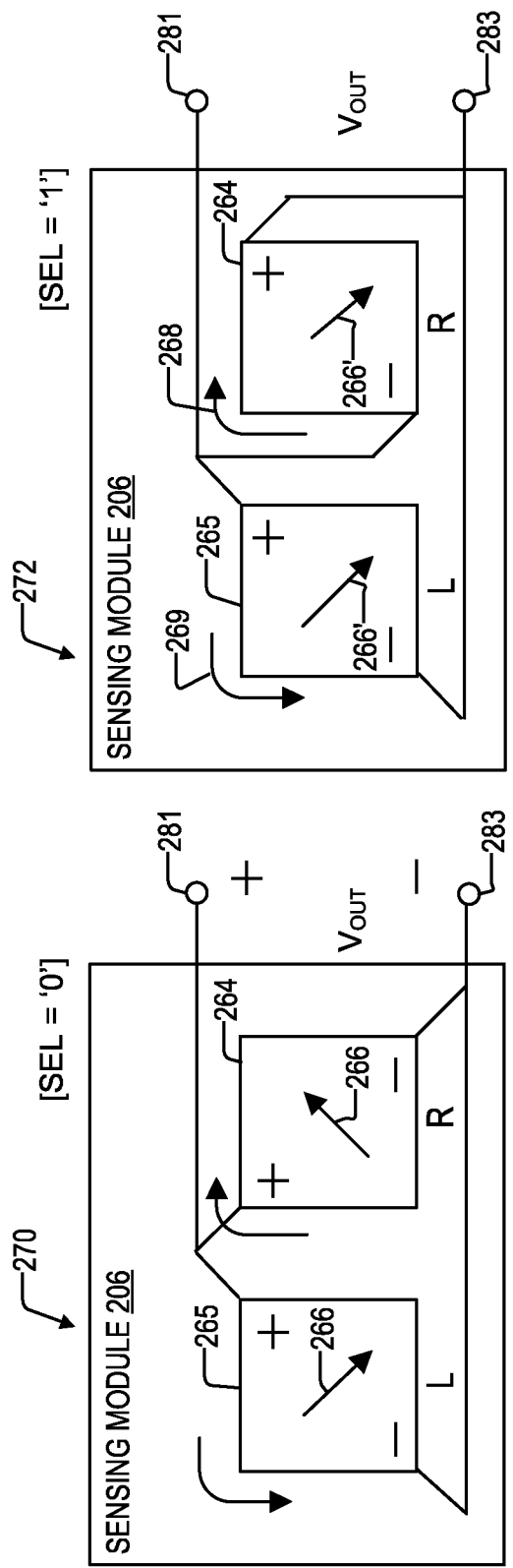
FIG. 2F is a diagram illustrating one possible implementation of a sensing module that is part of the magnetic field sensor of FIGS. 2A-B.
Figure 2G:
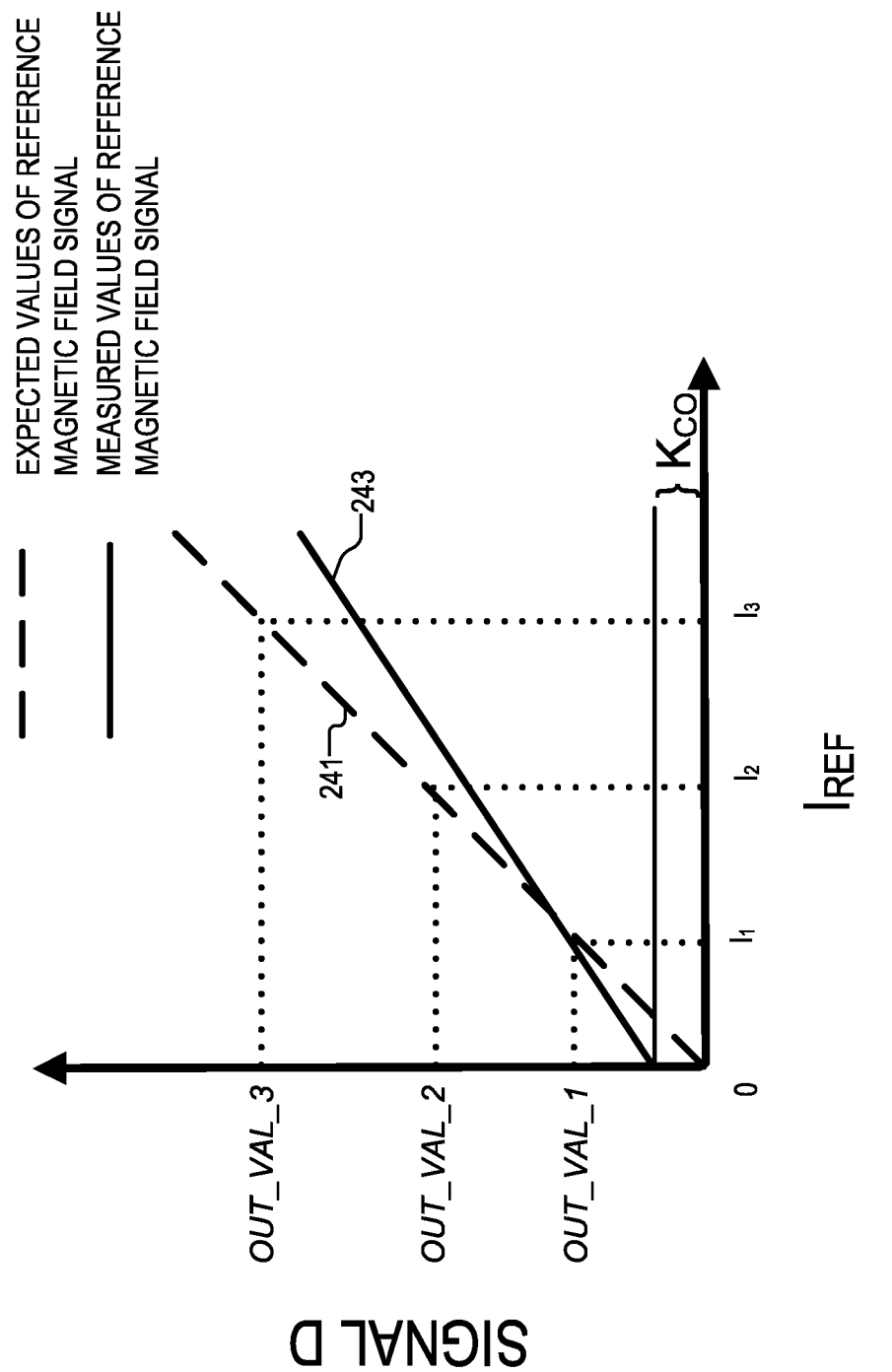
FIG. 2G is a plot illustrating ideal and measured values of a reference magnetic field signal, according to aspects of the disclosure.

FIG. 2G is a plot that illustrates the relationship between the actual values and the ideal values of the reference magnetic field signal. Shown along the X-axis are values $I_1$, $I_2$, and $I_3$, which would be assumed by the signal $I_{REF}$ when each of the drive codes in the drive code database 231 is applied to the coil driver 202. Also, shown along the Y-axis are the expected values of the measured magnetic field signal when each of the values $I_1$, $I_2$, and $I_3$ is assumed by the signal $I_{REF}$. Curve 241 shows the values, that the measured magnetic field signal is expected to have under ideal circumstances, and curve 243 shows the values of the measured magnetic field signal that are measured under normal operating conditions. Notably, the plot illustrates that the value of the calibration offset coefficient $K_{CO}$ may be equal to the value of the reference magnetic field signal when the reference coil 204 is not energized.

FIG. 2F shows the sensing module 206, in accordance with one possible implementation. As illustrated, the sensing module 206 may include Hall elements 265 and 264 that are coupled to terminals 281 and 283. In addition, the sensing module 206 may include one or more switches (not shown) that are turned on and off in response to the signal SEL and arranged to change how the Hall elements 265 and 264 are connected to each other and to the terminals 281- and 283. In this regard, diagram 270 shows the connectivity of Hall elements 264 and 265 when signal SEL is set to '0' and the sensor 104 is in the active state. Diagram 272, on the other hand, shows the connectivity of the Hall elements 264 and 265 when the signal SEL is set to '1' and the sensor 104 is in the calibration state.

In diagram 270, the sensing module 206 is arranged so that a current 266 flows through Hall element 264 in a first direction (e.g. from the bottom left to the top right as shown in diagram 270), and the output voltage $V_{OUT}$ of sensing module 206 is taken across Hall element 264 from the top left to the bottom right. Sensing module 206 is also arranged so that a current 266 flows through Hall element 265 in a first direction (e.g. from the top left to the bottom right as shown in diagram 270), and the output voltage $V_{OUT}$ of sensing module 206 is taken across Hall element 265 from the top right to the bottom left. In this arrangement, the Hall elements 264 and 265 provide an average of a detected external magnetic field and reject any reference magnetic field that is output by the reference coil 204. The axis of maximum sensitivity of the Hall elements may be configured to detect the external magnetic field 106. I.e. with the current 266 flowing in this direction, the axis of greatest sensitivity of Hall element 264 may be aligned to detect the external magnetic field (e.g., the external magnetic field that is shown in FIG. 1). Thus, this arrangement may be used during the measured time period to detect the measured magnetic field. Although not required, the coil driver 202 that energizes reference coil 204 to produce the reference magnetic field may be disabled during the active periods so that the reference magnetic field does not interfere with the detection of the measured magnetic field.

In diagram 272, Hall element 264 may be switched so that current 266' flows from the top left to the bottom right, and the output voltage $V_{OUT}$ of Hall element 264 is taken across Hall element 264 from the bottom left to the top right. Additionally, Hall element 265 may be switched so that current 266' also flows from the top left to the bottom right, but the output voltage $V_{OUT}$ of sensing module 206 is taken across Hall element 265 from the top right to the bottom left. In this arrangement, the Hall elements 264 and 265 may cancel or reject the external magnetic field and provide an average of the reference magnetic field produced by reference coil 204. With the current 266' flowing in this direction, the axis of greatest sensitivity of Hall element 264 may be aligned to detect the reference magnetic field produced by reference coil 204.

In some implementations, the reference magnetic field produced by reference coil 204 is a differential magnetic field, and the arrangements of Hall elements 264 and 265 in diagram 272 allow sensing module 206 to detect the differential magnetic field. For example, current may flow through at least a portion of reference coil 204 in the direction of arrow 268 to produce a local magnetic field with a direction into the page near Hall element 264.

Current may also flow through another portion of reference coil 204 (or through another coil) in the direction of arrow 269 to produce a magnetic field with a direction out of the page near Hall element 265. In the arrangement shown in diagram 272, Hall element 264 may be configured to detect the magnetic field produced by current flowing in direction 268 and having a direction into the page, and Hall element 265 may be configured to detect the magnetic field produced by the current flowing in direction 269 and having a direction out of the page. U.S. Pat. No. 8,680,846, which is incorporated here by reference, includes other examples of Hall element configurations.

The illustrated configurations in FIG. 2F show one way to alternately generate a reference magnetic field signal. In other implementations, there may be other possible circuits and techniques that can generate a reference magnetic field for use by the sensor 104.

Figure 3:
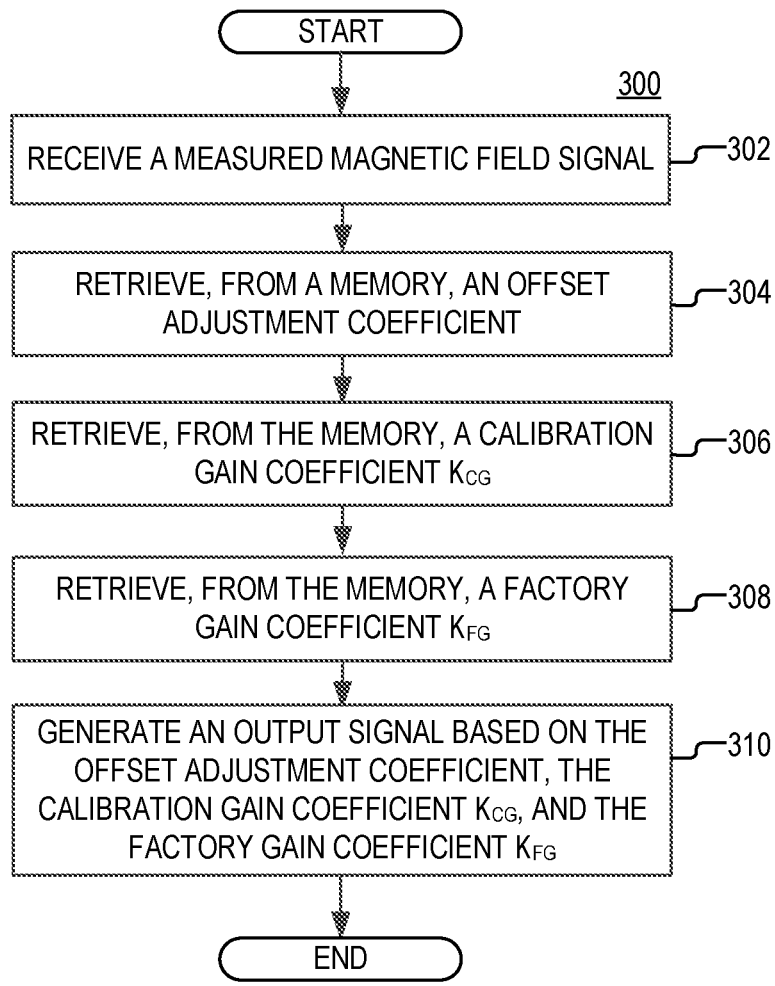
FIG. 3 is a flowchart of an example of a process, according to aspects of the disclosure.

FIG. 3 is a flowchart of an example of a process 300 for adjusting a measured magnetic field signal. According to the example of FIG. 3, the process 300 is performed by the correction module 216. However, the present disclosure is not limited thereto. In this regard, it will be understood that each of the steps in the process 300 may be performed by any of the components of the sensor 104.

At step 302, a measured magnetic field signal is received by the correction module 216. The measured magnetic field signal may be any suitable type of signal that is generated by the sensing module 206 during one of the active periods of the operation of the sensor 104. According to the present example, the measured magnetic field signal is the signal SM that is output from the filter 214 (shown in FIG. 2B).

At step 304, an offset coefficient $K'_O$ is retrieved from the memory 232 by the correction module 216. According to the present example, the offset coefficient $K'_O$ is the calibration offset coefficient $K_{CO}$. However, alternative implementations are possible in which the offset coefficient $K'_O$ is the factory offset coefficient $K_{FO}$.

At step 306, the calibration gain coefficient $K_{CG}$ is retrieved from the memory 232 by the correction module 216.

At step 308, the factory gain coefficient $K_{FG}$ is retrieved from the memory 232 by the correction module 216.

At step 310, the correction module 216, generates the output signal OUT by correcting the gain and offset of the measured magnetic field signal SM (received at step 302). According to the present example, the output signal OUT is generated in accordance with Equation 1 below:

$$\text{OUT} = (SM - K'_O)\left(\frac{K_{FG}}{K_{CG}}\right) \quad (1)$$

where OUT is the output signal, SM is the measured magnetic field signal (received at step 302), $K'_O$ is the offset coefficient (retrieved at step 304), $K_{CG}$ is the calibration gain coefficient (retrieved at step 306), and $K_{FG}$ is the factory gain coefficient (retrieved at step 308). In one respect, Equation 1 indicates that the calibration gain coefficient $K_{CG}$ may be used to scale the value of the factory gain coefficient $K_{FG}$, after which the scaled coefficient is used to adjust the gain of the measured magnetic field signal SM by multiplying the scaled coefficient by the measured magnetic field signal SM.

Figure 4:
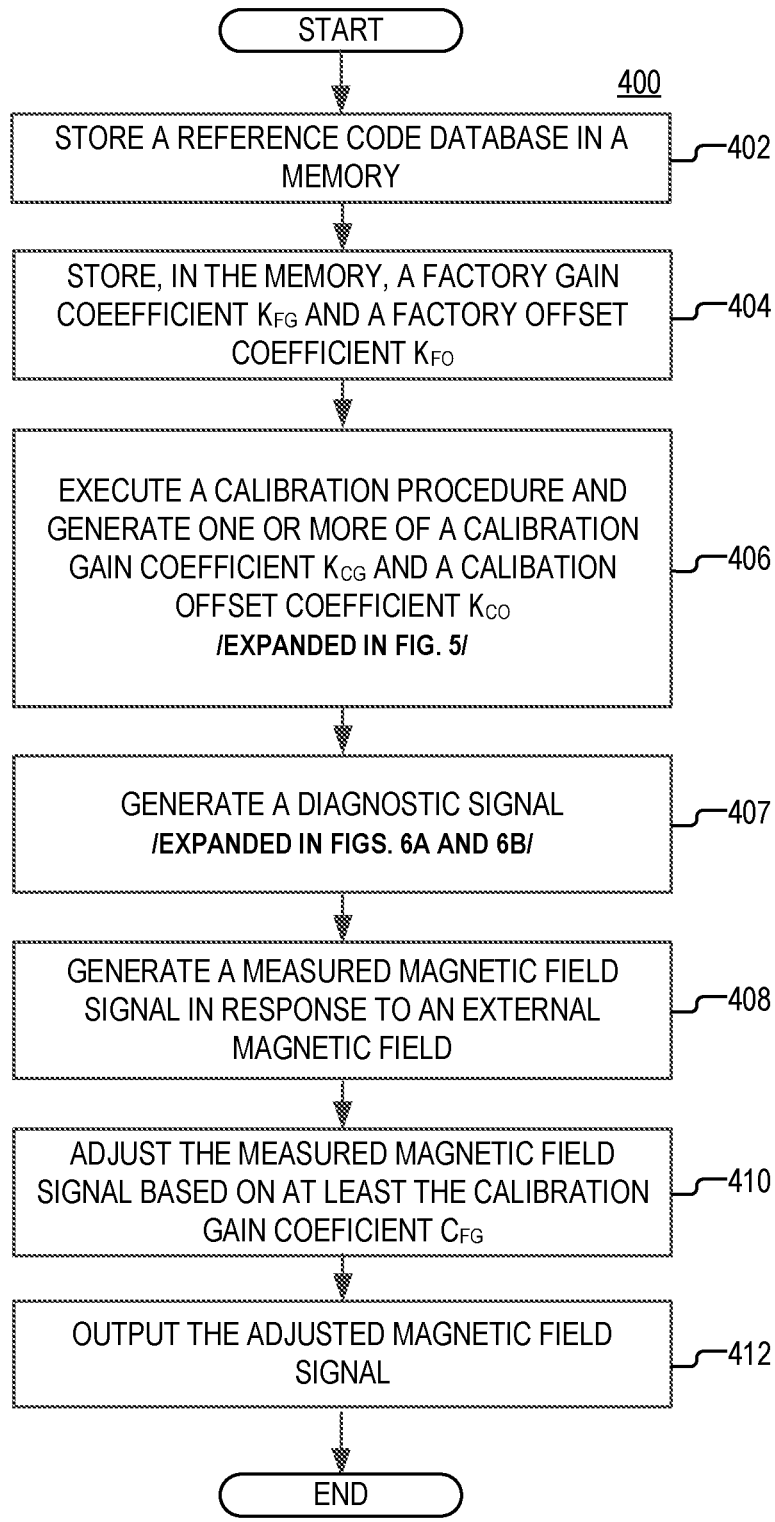
FIG. 4 is a flowchart of an example of a process, according to aspects of the disclosure.

FIG. 4 is a flowchart of an example of a process 400, according to aspects of the disclosure. At step 402, the drive code database 231 is stored in the memory 232. At step 404, the factory gain coefficient $K_{FG}$ and the factory offset coefficient $K_{FO}$ are stored in the memory 232. In some implementations, steps 402 and 404 may be performed while the sensor 104 is in the factory, prior to the sensor 104 being shipped to an end customer. At step 406, the sensor 104 executes a calibration procedure based on the reference codes that are stored in the drive code database 231 and generates one or more of the calibration gain coefficient $K_{CG}$ and the calibration offset coefficient $K_{CO}$. In some implementations, step 406 may be performed in accordance with the process 500, which is discussed further below with respect to FIG. 5. At step 407, the sensor 410 generates a diagnostic signal. In some implementations, step 407 may be performed in accordance with one of processes 600A and 600B, which are discussed further below with respect to FIGS. 6A-B. At step 408, the sensor 104 generates a measured magnetic field signal in response to an external magnetic field. The measured magnetic field signal may be generated by the sensing module 206. At step 410, the measured magnetic field signal is adjusted to produce an output signal OUT. The measured magnetic field signal may be adjusted based on at least one of the calibration gain coefficient $K_{CG}$, the calibration offset coefficient $K_{CO}$, the factory gain coefficient $K_{FG}$, and the factory offset coefficient $K_{FO}$. In some implementations, the step 410 may be performed in accordance with the process 300, which is discussed above with respect to FIG. 3. At step 412, the output signal OUT is output. In some implementations, steps 408-412 may be performed while the sensor 104 is in the active state.

Figure 5:
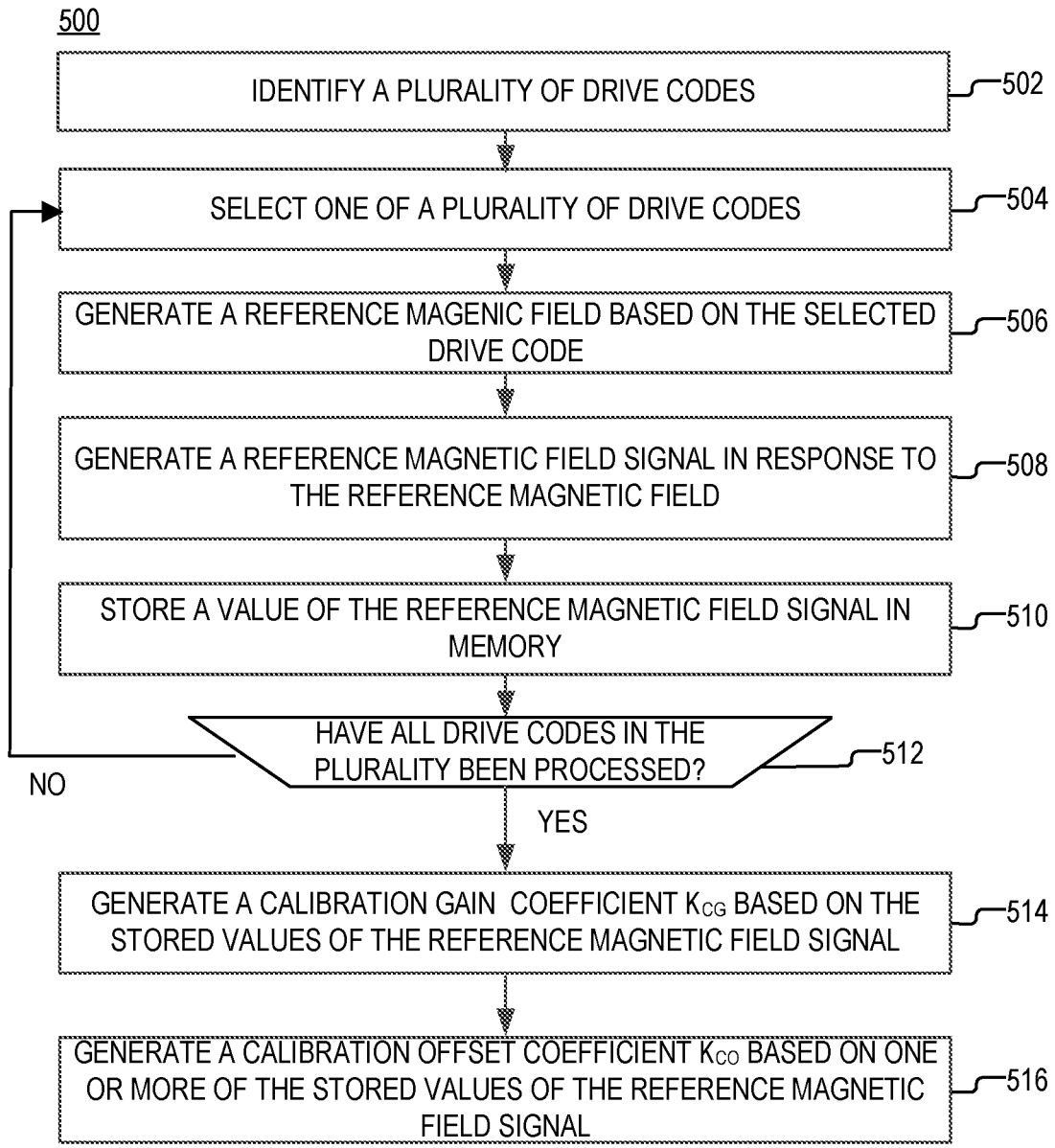
FIG. 5 is a flowchart of an example of a process, according to aspects of the disclosure.

FIG. 5 is a flowchart of an example of a process 500, according to aspects of the disclosure. According to the example of FIG. 5, the process 500 is performed by the control logic 226. However, the present disclosure is not limited thereto. In this regard, it will be understood that each of the steps in the process 500 may be performed by any of the components of the sensor 104.

At step 502, a plurality of drive codes is identified. In some implementations, identifying the plurality of drive codes includes retrieving the plurality of drive codes from the memory 232.

At step 504, one of the plurality of drive codes is selected. At step 506, a reference magnetic field is generated based on the selected drive code. In some implementations, generating the reference magnetic field based on the selected drive code includes driving the reference coil 204 with an electrical current that has at least some of the characteristics specified by the selected drive code. Additionally or alternatively, in some implementations, generating the reference magnetic field includes providing an indication of the selected drive code to the coil driver 202. As discussed above, the coil driver may be arranged to configure the signal $I_{REF}$ that is used to drive the reference coil 204 in accordance with the characteristics specified by the drive code.

At step 508, a reference magnetic field signal is generated in response to the reference magnetic field. The reference magnetic field signal may be generated by sensing module 206. The reference magnetic field signal may be the same or similar to the filtered signal D that is output by the filter 224 (shown in FIG. 2B).

At step 510, the value of the reference magnetic field signal is stored in the memory 232.

At step 512, a determination is made if each of the plurality of drive codes (identified at step 502) has been selected once. If all of the plurality of drive codes have been selected, the process 500 proceeds to step 514. Otherwise, the process 500 returns to step 504, and another one of the plurality of drive codes is selected, which has not been selected during a previous iteration of steps 504-510.

At step 514, the calibration gain coefficient $K_{FG}$ is calculated based on the values of the reference magnetic field signal that are generated in different iterations of steps 504-510. In some implementations, the calibration gain coefficient KFG may be calculated based on equation 2 below:

$$K_{CG} = \left(\frac{1}{i-2}\right)\sum_{i=0}^{N} \frac{D_{i+2} - D_{i+1}}{D_{(i+1)} - D_i} \quad (2)$$

where $K_{CG}$ is the calibration gain coefficient, i is an integer counter, and $D_i$ is the i-th value in the plurality of values of the reference magnetic field signal that are generated at different iterations of steps 504-510, and N is a count of values in the plurality of values. In some implementations, each iteration of steps 506-510 may be performed during a different calibration period. In this regard, in some implementations, each value Di may be a value of the reference magnetic field signal that is measured in a different calibration period. In some implementations, choosing a value for i that is greater than or equal to three (i.e., choosing to use three or more values of the reference magnetic field signal as a basis for generating $K_{CG}$) allows for flexibility in choosing the values without any constraints as long as they are within the dynamic range of the reference signal path 230. As an example, in the case of a fully differential implementation, two different values D of the measured magnetic field signal may be generated by reversing the polarity of the reference coil 204 while applying the same voltage, and the 3rd value D of may be obtained while the reference coil 204 is turned off (i.e., when $I_{REF}$=0). In some respects, two values of D may be sufficient to perform first-order gain correction.

At step 516, the value of the calibration offset coefficient $K_{CO}$ is generated. In some implementations, the value of the calibration offset coefficient $K_{CO}$ may be generated based on the value of the measured magnetic field signal while the reference coil 204 is not energized. This value may be obtained either by using a drive code that causes the reference coil to remain disconnected (i.e., not energized) during a particular calibration period, or it can be approximated by curve-fitting other sampled values of the measured magnetic field signal.

The process 500 is provided as an example only. In this regard, at least some of the steps of the process 500 may be performed in a different order, performed in parallel, and altogether omitted. For example, step 502 may be omitted and steps 504 may be executed by using digital logic that cycles the connectivity of the reference coil 204 through three different configurations—i.e., a configuration in which the coil is disconnected and not energized, a configuration in which current I runs through the reference coil 204 in one direction, and a configuration in which the same current I runs through the reference coil 204 in the opposite direction. As can be readily appreciated, the reference magnetic field may have a net flux of zero (in the absence of noise) when the reference coil 204 is not energized. Although in the example of FIG. 5 equation 2 is used to calculate the value of the calibration gain coefficient $K_{CG}$, alternative implementations are possible in which equation 3 below is used instead:

$$K_{CG} = \left(\frac{1}{i-2}\right)\sum_{i=0}^{N} \frac{D_{i+3} - D_{i+2}}{D_{(i+1)} - D_i} \quad (3)$$

where $K_{CG}$ is the calibration gain coefficient, i is an integer counter, and $D_i$ is the i-th value in the plurality of values of the reference magnetic field signal that are generated at different iterations of steps 504-510, and N is a count of values in the plurality of values. It will be understood equations 2 and 3 are provided as an example only and the present disclosure is not limited thereto. It will be further understood that equations 2 and 3 provide different methods for calculating the value of $K_{CG}$ based on the ratio between a first difference between two of the plurality of values and a second difference between two of the plurality of values, wherein the first difference is different from the second difference.

Figures 6A, 6B:
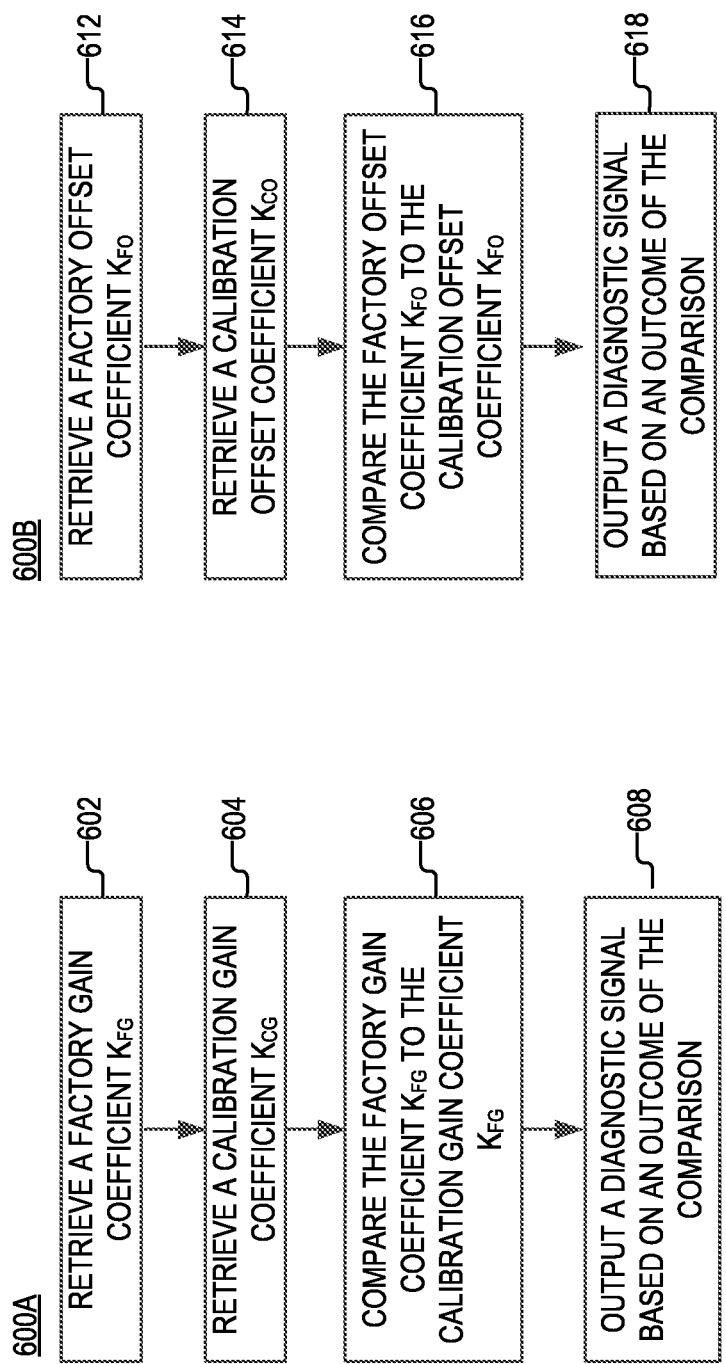
FIG. 6A is a flowchart of an example of a process, according to aspects of the disclosure.
FIG. 6B is a flowchart of an example of a process, according to aspects of the disclosure.

FIG. 6A is a flowchart of an example of a process 600A, according to aspects of the disclosure. According to the example of FIG. 6A, the process 600A is performed by the diagnostic logic 234. However, the present disclosure is not limited thereto. In this regard, it will be understood that each of the steps in the process 600A may be performed by any of the components of the sensor 104. At step 602, the factory gain coefficient $K_{FG}$ is retrieved from the memory 232. At step 604, the calibration gain coefficient $K_{CG}$ is retrieved from the memory 232. At step 606, the factory gain coefficient $K_{FG}$ is compared to the calibration gain coefficient $K_{CG}$. At step 608, the diagnostic signal DIAG is output based on the outcome of the comparison. In some implementations, comparing the factory gain coefficient $K_{FG}$ to the calibration gain coefficient $K_{CG}$ may include calculating a difference between $K_{CG}$ and $K_{FG}$. If the difference is below a certain threshold, the signal DIAG may be set to a first value (e.g., '0'). When the signal DIAG is set to the first value (e.g., '0'), this may indicate the absence of a fault in the operation of the sensor 104. If the difference is above the threshold, the signal DIAG may be set to a second value (e.g., '1'). When the signal DIAG is set to the second value (e.g., '1'), this may indicate the presence of a fault.

FIG. 6B is a flowchart of an example of a process 600B, according to aspects of the disclosure. According to the example of FIG. 6B, the process 600B is performed by the diagnostic logic 234. However, the present disclosure is not limited thereto. In this regard, it will be understood that each of the steps in the process 600B may be performed by any of the components of the sensor 104. At step 612, the factory offset coefficient $K_{FO}$ is retrieved from the memory 232. At step 614, the calibration offset coefficient $K_{CO}$ is retrieved from the memory 232. At step 616, the factory offset coefficient $K_{FO}$ is compared to the calibration offset coefficient $K_{CO}$. At step 618, the diagnostic signal DIAG is output based on the outcome of the comparison. In some implementations, comparing the factory offset coefficient $K_{FO}$ to the calibration offset coefficient $K_{CO}$ may include calculating a difference between $K_{CO}$ and $K_{FO}$. If the difference is below a certain threshold, the signal DIAG may be set to a first value (e.g., '0'). When the signal DIAG is set to the first value (e.g., '0'), this may indicate the absence of a fault in the operation of the sensor 104. If the difference is above the threshold, the signal DIAG may be set to a second value (e.g., '1'). When the signal DIAG is set to the second value (e.g., '1'), this may indicate the presence of a fault. It will be understood that FIGS. 6A-B are provided as an example only and the present disclosure is not limited to any specific method for using discrepancies between $K_{CG}$ and $K_{FG}$ and $K_{FO}$ and $K_{CO}$ to generate a diagnostic signal.

FIGS. 1-6B are provided as an example only. It will be understood that the techniques for calculating and using the calibration gain coefficient $K_{CG}$, and the factory gain coefficient $K_{FG}$ are not limited to the architecture shown in FIGS. 2A-B, and/or any specific sensor architecture. As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, a magnetic tunnel junction (MTJ), a spin-valve, etc. The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR, spin-valve) and vertical Hall elements tend to have axes of sensitivity parallel to a substrate.

It will be appreciated by those of ordinary skill in the art that while a substrate (e.g. a semiconductor substrate) is described as "supporting" the magnetic field sensing element, the element may be disposed "over" or "on" the active semiconductor surface, or may be formed "in" or "as part of" the semiconductor substrate, depending upon the type of magnetic field sensing element. For simplicity of explanation, while the embodiments described herein may utilize any suitable type of magnetic field sensing elements, such elements will be described here as being supported by the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor may be used in combination with a back-biased or other magnet, and a magnetic field sensor that senses a magnetic field density of a magnetic field.

As used herein, the term "target" is used to describe an object to be sensed or detected by a magnetic field sensor or magnetic field sensing element. A target may be ferromagnetic or magnetic.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms, do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A method for use in a magnetic field sensor, comprising:
in each of a plurality of calibration periods, generating a reference magnetic field based on a different one of a plurality of drive codes;
storing, in a memory, a plurality of values of a reference magnetic field signal that is generated in response to the reference magnetic field, each of the values of the reference magnetic field signal being generated by sampling the reference magnetic field in a different one of the plurality of calibration periods;
calculating a calibration gain coefficient based on the plurality of values of the reference magnetic field signal; and
storing the calibration gain coefficient in the memory and using the calibration gain coefficient to adjust an output of the magnetic field sensor,
wherein the calibration gain coefficient is calculated based on a ratio of (i) a first difference between two of the plurality of values, and (ii) a second difference between two of the plurality of values, the first difference being different from the second difference.

2. A method for use in a magnetic field sensor comprising:
in each of a plurality of calibration periods, generating a reference magnetic field based on a different one of a plurality of drive codes;
storing, in a memory, a plurality of values of a reference magnetic field signal that is generated in response to the reference magnetic field, each of the values of the reference magnetic field signal being generated by sampling the reference magnetic field in a different one of the plurality of calibration periods;
calculating a calibration gain coefficient based on the plurality of values of the reference magnetic field signal; and
storing the calibration gain coefficient in the memory and using the calibration gain coefficient to adjust an output of the magnetic field sensor,
wherein the calibration gain coefficient is generated in accordance with the equation of:

$$K_{CG} = \left(\frac{1}{i-2}\right)\sum_{i=0}^{N}\frac{D_{i+2} - D_{i+1}}{D_{(i+1)} - D_i}$$

where $K_{CG}$ is the calibration gain coefficient, i is an integer counter, $D_i$ is the i-th value in the plurality of values of the reference magnetic field signal, and N is a count of values in the plurality of values.

3. The method of claim 1, wherein the reference magnetic field is generated by a reference coil, and each of the plurality of drive codes specifies a respective magnitude and direction of an electrical current for driving the reference coil.

4. The method of claim 1, wherein the reference magnetic field is generated by a reference coil, and generating the reference magnetic field based on any given one of the plurality of drive codes includes causing a coil driver to drive the reference coil with an electrical current that is specified by the given one of the plurality of drive codes.

5. Or use in a magnetic field sensor, comprising:
in each of a plurality of calibration periods, generating a reference magnetic field based on a different one of a plurality of drive codes;
storing in a memory, a plurality of values of a reference magnetic field signal that is generated in response to the reference magnetic field, each of the values of the reference magnetic field signal being generated by sampling the reference magnetic field in a different one of the plurality of periods,
calculating a calibration gain coefficient based on the plurality of values of the reference magnetic field signal, and
storing the calibration gain coefficient in the memory and using the calibration gain coefficient to adjust an output of the magnetic field sensor; and
generating a diagnostic signal based on a difference between the calibration gain coefficient and a factory gain coefficient.

6. A method for use in a magnetic field sensor, comprising:
in each of a plurality of calibration periods, generating a reference magnetic field based on a different one plurality of drive codes;

storing, in memory, a plurality of values of a reference agnetic field signal that is generated in response to the reference magnetic field, each of the values of the reference magnetic field signal being generated by sampling the reference magnetic field in a different one of the plurality of calibration periods;

calculating a calibration gain coefficient based on the plurality of values of the reference agnetic ie signal; and storing the calibration gain coefficient in the memory and using the calibration gain coefficient to adjust an output of the magnetic field sensor, wherein using the calibration gain coefficient to adjust an output of the magnetic field sensor includes: retrieving, from the memory, a factory gain coefficient; generating a measured magnetic field signal in response to an external magnetic field; and adjusting the measured magnetic field signal to produce an adjusted magnetic field signal, the adjustment being performed based on both of the factory gain coefficient and the calibration gain coefficient.

7. The method of claim 6, wherein the measured magnetic field signal is generated in accordance with the equation of:

$$M_{adj} = (SM - K'_O)\left(\frac{K_{FG}}{K_{CG}}\right)$$

where SM is the measured magnetic field signal, $M_{adj}$ is the adjusted measured magnetic field signal, $K'_O$ is an offset coefficient, $K_{CG}$ is the calibration gain coefficient, and $K_{FG}$ is a factory gain coefficient, the offset coefficient $K'_O$ being based on at least one of a factory offset coefficient and a calibration offset coefficient.

8. The method of claim 7, wherein:

the measured magnetic field signal is generated in each of a plurality of active periods and the reference magnetic field signal and the measured magnetic field signal are each generated by a sensing module including two or more magnetic field sensing elements, such that in each of the active periods the magnetic field sensing elements are configured to reject the reference magnetic field and in each of the calibration periods the magnetic field sensing elements are configured to reject the measured magnetic field, and the magnetic field sensing elements include one or more of a planar Hall element, a vertical Hall element, a Circular Vertical Hall (CVH) element, an Indium Antimonide (InSb) element, a giant magnetoresistance (GMR) element, an anisotropic magnetoresistance element (AMR), a tunneling magnetoresistance (TMR) element, a magnetic tunnel junction (MTJ), and/or a spin-valve.

9. The method of claim 1, wherein a given of the plurality of drive codes specifies zero as a level of electrical current that should be passed through a reference coil, the method further comprising:

generating a calibration offset coefficient based on a value of the reference magnetic field signal while the reference coil is not energized;

retrieving, from the memory, a factory offset coefficient;

calculating a difference between the factory offset coefficient and the calibration offset coefficient; and outputting a diagnostic signal based on the difference, wherein the diagnostic signal is set to a first value that is indicative of a fault when the difference exceeds a predetermined threshold, and the diagnostic signal is set to a second value that is indicative of no fault when the difference does not exceed the predetermined threshold.

10. A magnetic field sensor, comprising:

a sensing module including at least two magnetic field sensing elements;

a memory; and a processing circuitry that is configured to:

in each of a plurality of calibration periods, generate a reference magnetic field based on a different one of a plurality of drive codes;

store, in the memory, a plurality of values of a reference magnetic field signal that is generated by the sensing module in response to the reference magnetic field, each of the values of the reference magnetic field signal being generated by sampling the reference magnetic field in a different one of the plurality of calibration periods;

calculate a calibration gain coefficient based on the plurality of values of the reference magnetic field signal; and store the calibration gain coefficient in the memory and use the calibration gain coefficient to adjust an output of the magnetic field sensor, wherein the calibration gain coefficient is calculated based on a ratio of (i) a first difference between two of the plurality of values, and (ii) a second difference between two of the plurality of values, the first difference being different from the second difference.

11. A magnetic field sensor comprising:

a sensing module including at least two magnetic field sensing elements;

a memory; and a processing circuitry that is configured to:

in each of a plurality of calibration periods, generate a reference magnetic field based on a different one of a plurality of drive codes;

store, in the memory, a plurality of values of a reference magnetic field signal that is generated by the sensing module in response to the reference magnetic field, each of the values of the reference magnetic field signal being generated by sampling the reference magnetic field in a different one of the plurality of calibration periods;

calculate a calibration gain coefficient based on the plurality of values of the reference magnetic field signal, and store the calibration gain coefficient in the memory and use the calibration gain coefficient to adjust an output of the magnetic field sensor wherein the calibration gain coefficient is generated in accordance with the equation of:

$$K_{CG} = \left(\frac{1}{i-2}\right)\sum_{i=0}^{N} \frac{D_{i+2} - D_{i+1}}{D_{(i+1)} - D_i}$$

where $K_{CG}$ is the calibration gain coefficient, i is an integer counter, $D_i$ is the i-th value in the plurality of values of the reference magnetic field signal, and N is a count of values in the plurality of values.

12. The magnetic field sensor of claim 10, wherein the reference magnetic field is generated by a reference coil, and each of the plurality of drive codes specifies a respective magnitude and direction of an electrical current for driving the reference coil.

13. The magnetic field sensor of claim 10, wherein the reference magnetic field is generated by a reference coil, and generating the reference magnetic field based on any given one of the plurality of drive codes includes causing a coil driver to drive the reference coil with an electrical current that is specified by the given one of the plurality of drive codes.

14. A magnetic field sensor, comprising:
a sensing module including at least two magnetic field sensing elements;
memory, and
processing circuitry that is configured to:
in each of a plurality of calibration periods, generate a reference magnetic field based on a different one of a plurality of drive codes;
store, in the memory, a plurality of values of a reference magnetic field signal that is generated by the sensing module in response to the reference magnetic field, each of the values of the reference magnetic field signal being generated by sampling the reference magnetic field in a different one of the plurality of calibration periods;
calculate a calibration gain coefficient based on the plurality of values of the reference magnetic field signal; and
store the calibration gain coefficient in the memory and use the calibration gain coefficient to adjust an output of the magnetic field sensor,
wherein the processing circuitry is further configured to generate a diagnostic signal based on a difference between the calibration gain coefficient and a factory gain coefficient.

15. A magnetic field sensor comprising:
a sensing module including at least two magnetic field sensing elements;
a memory, and
a processing circuitry that is configured to:
in each of a plurality of calibration periods, generate a reference magnetic field based on a different on of a plurality of drive codes;
store, in the memory, a plurality of values of a reference magnetic field signal that is generated by the sensing module in response to the refer ace magnetic field, each of the values of the reference magnetic field signal being generated by sampling the reference magnetic field in a different one of the plurality of calibration periods;
calculate a calibration gain coefficient based on the plurality of values of the reference magnetic field signal, and
store the calibration gain coefficient in the memory and use the calibration gain coefficient to adjust an output of the magnetic field sensor,
wherein using the calibration gain coefficient to adjust an output of the magnetic field sensor includes: retrieving, from the memory, a factory gain coefficient; generating a measured magnetic field signal in response to an external magnetic field; and adjusting the measured magnetic field signal to produce an adjusted magnetic field signal, the adjustment being performed based on both of the factory gain coefficient and the calibration gain coefficient.

16. The magnetic field sensor of claim 15, wherein the measured magnetic field signal is generated in accordance with the equation of:

$$M_{adj} = (SM - K'_O)\left(\frac{K_{FG}}{K_{CG}}\right)$$

where SM is the measured magnetic field signal, $M_{adj}$ is the adjusted measured magnetic field signal, $K'_O$ is an offset coefficient, $K_{CG}$ is the calibration gain coefficient, and $K_{FG}$ is a factory gain coefficient, the offset coefficient $K'_O$ being based on at least one of a factory offset coefficient and a calibration offset coefficient.

17. The magnetic field sensor of claim 16, wherein:
the measured magnetic field signal is generated in each of a plurality of active periods and the reference magnetic field signal and the measured magnetic field signal are each generated by the sensing module, such that in each of the active periods the magnetic field sensing elements are configured to reject the reference magnetic field and in each of the calibration periods the magnetic field sensing elements are configured to reject the measured magnetic field, and
the magnetic field sensing elements include one or more of a planar Hall element, a vertical Hall element, a Circular Vertical Hall (CVH) element, an Indium Antimonide (InSb) element, a giant magnetoresistance (GMR) element, an anisotropic magnetoresistance element (AMR), a tunneling magnetoresistance (TMR) element, a magnetic tunnel junction (MTJ), and/or a spin-valve.

18. The magnetic field sensor of claim 10, wherein a given of the plurality of drive codes specifies zero as a level of electrical current that should be passed through the reference coil, and the processing circuitry is further configured to:
generate a calibration offset coefficient based on a value of the reference magnetic field signal while the reference coil is not energized;
retrieve, from the memory, a factory offset coefficient;
calculate a difference between the factory offset coefficient and the calibration offset coefficient; and
output a diagnostic signal based on the difference, wherein the diagnostic signal is set to a first value that is indicative of a fault when the difference exceeds a predetermined threshold, and the diagnostic signal is set to a second value that is indicative of no fault when the difference does not exceed the predetermined threshold.

19. A magnetic field sensor, comprising:
a sensing module including at least two magnetic field sensing elements;
a memory; and
a processing circuitry that is configured to:
generate a calibration offset coefficient based on a value of a reference magnetic field signal while a reference coil is not energized, the reference magnetic signal being generated by the sensing module in response to a reference magnetic field that is produced by the reference coil;
retrieve, from the memory, a factory offset coefficient;
calculate a difference between the factory offset coefficient and the calibration offset coefficient; and
output a diagnostic signal based on the difference, wherein the diagnostic signal is set to a first value that is indicative of a fault when the difference exceeds a predetermined threshold, and the diagnostic signal is set to a second value that is indicative of no fault when the difference does not exceed the predetermined threshold.

20. The magnetic field sensor of claim 19, wherein the processing circuitry is further configured to:
- in each of a plurality of calibration periods, cause the reference coil to generate the reference magnetic field based on a different one of a plurality of drive codes;
- store, in the memory, a plurality of values of the reference magnetic field signal, each of the values of the reference magnetic field signal being generated by sampling the reference magnetic field signal in a different one of the plurality of calibration periods;
- calculate a calibration gain coefficient based on the plurality of values of the reference magnetic field signal; and
- store the calibration gain coefficient in the memory and use the calibration gain coefficient to adjust an output of the magnetic field sensor.

\* \* \* \* \*